US012699136B2

(12) United States Patent
Uchida

(10) Patent No.: US 12,699,136 B2
(45) Date of Patent: Aug. 4, 2026

(54) APPARATUS AND TEST ELEMENT GROUP

(71) Applicant: Micron Technology, Inc., Boise, ID (US)

(72) Inventor: Fumie Uchida, Kyoto (JP)

(73) Assignee: Micron Technology, Inc., Boise, ID (US)

( * ) Notice: Subject to any disclaimer, the term of this patent is extended or adjusted under 35 U.S.C. 154(b) by 260 days.

(21) Appl. No.: 18/441,926

(22) Filed: Feb. 14, 2024

(65) Prior Publication Data

US 2024/0302433 A1     Sep. 12, 2024

Related U.S. Application Data

(60) Provisional application No. 63/489,520, filed on Mar. 10, 2023.

(51) Int. Cl.
G01R 31/3187     (2006.01)
G01R 31/28     (2006.01)

(52) U.S. Cl.
CPC ..... G01R 31/3187 (2013.01); G01R 31/2884 (2013.01)

(58) Field of Classification Search
CPC ............ G01R 31/3187; G01R 31/2884; G11C 29/1201; G11C 29/48; G11C 29/56016; G11C 2029/1206; H01L 22/34

USPC ..................................... 324/750.3, 537, 500
See application file for complete search history.

(56) References Cited

U.S. PATENT DOCUMENTS

| | | | | |
|---|---|---|---|---|
| 8,486,802 B2 * | 7/2013 | Jang | ....................... | H10B 41/10 |
| | | | | 257/E21.546 |
| 8,865,482 B2 * | 10/2014 | Wang | ....................... | H01L 22/12 |
| | | | | 257/E21.333 |
| 9,606,155 B2 * | 3/2017 | Wang | ................. | G01R 31/2856 |
| 11,037,800 B2 | 6/2021 | Tomoyama et al. | | |
| 11,860,217 B2 * | 1/2024 | Liu | .................... | G01R 31/2642 |
| 12,007,429 B2 * | 6/2024 | Drennan | ............ | G01R 31/2601 |
| 2007/0241420 A1 * | 10/2007 | Choi | .................... | H10D 30/024 |
| | | | | 257/E27.103 |
| 2009/0190387 A1 * | 7/2009 | Kim | ......................... | G11C 8/14 |
| | | | | 365/182 |
| 2012/0187403 A1 * | 7/2012 | Lee | ......................... | H01L 22/34 |
| | | | | 257/E23.01 |
| 2018/0294043 A1 * | 10/2018 | Kim | ...................... | G11C 29/38 |
| 2020/0243416 A1 * | 7/2020 | Chen | ................... | H01L 23/4012 |

* cited by examiner

*Primary Examiner* — Giovanni Astacio-Oquendo
(74) *Attorney, Agent, or Firm* — Dorsey & Whitney LLP

(57)     ABSTRACT

According to one or more embodiments of the disclosure, an apparatus comprising a plurality of active regions on a semiconductor substrate, an active bridge region connecting two active regions among the plurality of active regions, and a plurality of test circuit elements on the active bridge region and the two active regions.

20 Claims, 12 Drawing Sheets

APPARATUS AND TEST ELEMENT GROUP

CROSS REFERENCE TO RELATED APPLICATION(S)

This application claims priority U.S. Provisional Application No. 63/489,520, filed Mar. 10, 2023. The aforementioned application is incorporated herein by reference, in its entirety, for any purpose.

BACKGROUND

A plurality of semiconductor chips are provided on a semiconductor wafer. The semiconductor chips include circuit regions and scribe regions. The circuit regions are provided in a matrix arrangement on the semiconductor wafer. In each circuit region, circuits including various circuit elements and components, such as transistors and conductive interconnects, are provided. The scribe regions are provided around the circuit regions. In certain portions of the scribe regions, test element groups (TEGs) may be provided. The TEGs include test circuits that are electrically probed to measure electric properties during testing. The test circuits in the scribe regions are formed by the same process used to form the circuits in the circuit regions on the same semiconductor wafer. The measured electric properties are used to determine whether the circuits formed in the circuit regions have the electric properties as expected or as designed.

DETAILED DESCRIPTION

Figure 1:
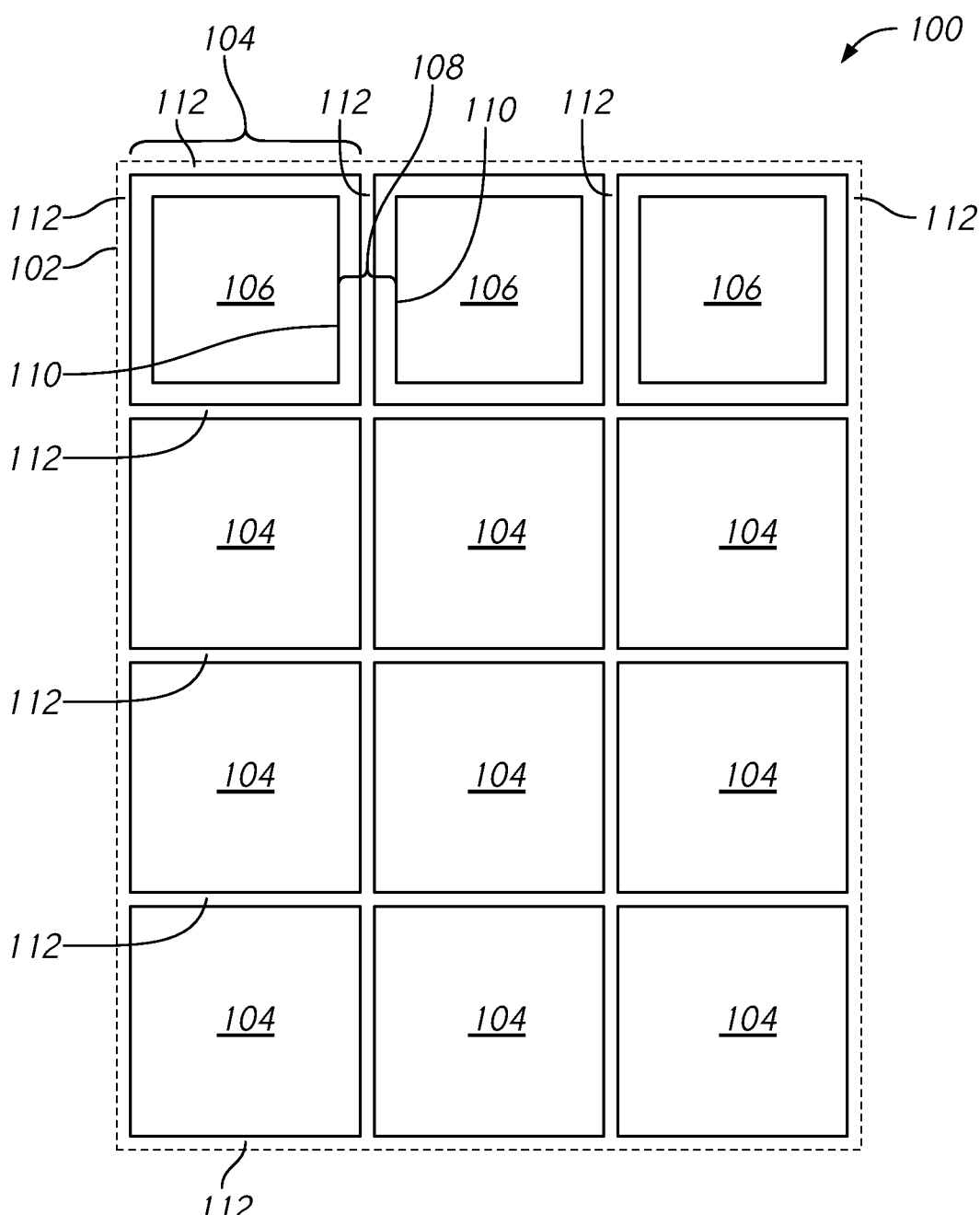
FIG. 1 depicts a layout of a plurality of semiconductor chips in a semiconductor wafer at least partly in a plan view according to an embodiment of the disclosure.

Various example embodiments of the disclosure will be described below in detail with reference to the accompanying drawings. The following detailed descriptions refer to the accompanying drawings that show, by way of illustration, specific aspects in which embodiments of the disclosure may be practiced. These embodiments are described in sufficient detail to enable those skilled in the art to practice the disclosure. Other embodiments may be utilized, and structure, logical and electrical changes may be made without departing from the scope of the disclosure. The various embodiments disclosed herein are not necessary mutually exclusive, as some disclosed embodiments can be combined with one or more other disclosed embodiments to form new embodiments.

In the descriptions, common or related elements and elements that are substantially the same are denoted with the same signs, and the descriptions thereof may be reduced or omitted. In the drawings, the dimensions and dimensional ratios of each unit do not necessarily match the actual dimensions and dimensional ratios in the embodiments.

FIG. 1 depicts an example of a layout of a plurality of semiconductor chips 104 in a semiconductor wafer 100 at least partly in a plan view in accordance with an embodiment of the disclosure. The semiconductor chips 104 may provide a plurality of semiconductor devices. The semiconductor chips 104 include circuit regions 106. Between the neighboring circuit regions 106 are scribe regions 108. The semiconductor chips 104 include circuit edges 110 around the corresponding circuit regions 106. Each semiconductor chip 104 may provide a memory device. A memory device is one example of a semiconductor device or an apparatus.

The circuit regions 106 are provided in a matrix arrangement. In each circuit region 106, circuits including various elements and components, such as transistors and conductive interconnects, are provided. In a case where the semiconductor chip 104 provides a memory device, the circuit region 106 may include a plurality of memory banks that have a plurality of memory cells, one or more circuits that provide memory access functions, such as read operations and write operations to the memory banks/cells, and a control circuit that controls the circuits. One example of a memory device is a dynamic random access memory (DRAM). The examples and the embodiments of the disclosure are not intended to be limited to DRAM. Memory devices other than DRAM, such as a static random-access memory (SRAM), a flash memory, an erasable programmable read-only memory (EPROM), a magnetoresistive random-access memory (MRAM), and a phase-change memory, may also be applicable. Other examples of the semiconductor device, such as logic ICs (a microprocessor, an application-specific integrated circuit (ASIC) or the like), may also be applicable.

The scribe regions 108 are provided around the circuit regions 106. Each scribe region 108 includes the circuit edges 110, facing one another in a plan view, of the adjacent or neighboring semiconductor chips 104. Each scribe region 108 includes a scribe center region 112 between the circuit edges 110 of the adjacent semiconductor chips 104. A scribe line or a dicing line may be defined in the scribe center region 112 to be used for separating the semiconductor wafer 100 into the individual semiconductor chips 104 by dicing.

The scribe region 108 according to the present embodiment includes one or more test element groups (TEGs). For example, certain portions of the scribe region 108, such as those other than the scribe center region 112, remain intact from dicing and include one or more TEGs. The intact portions of the scribe region 108 may also be referred as active areas within the scribe region 108. Each TEG includes one or more test circuits that are electrically probed to measure electric properties or electric characteristics thereof during testing. The test circuits of the TEG in the scribe region 108 are formed by the same process used to form the circuits in the circuit region 106 on the same semiconductor wafer 100. The measured electric properties are used to determine whether the circuits formed in the circuit region 106 have the expected or designed electric properties.

The test circuits of the TEG (may also be referred to as TEG circuits) includes, for example, test transistors and various pads, such as a gate pad and a source-drain pad. A gate pad may be electrically connected or coupled to a gate of a test transistor. A source-drain pad may be electrically connected or coupled to a source and a drain of a test transistor. Pads may be provided in one single layer or in a plurality of layers stacked on each other above a semiconductor substrate. Insulating layers may be provided between the layers and the semiconductor substrate. The pads may be provided in a lower most layer on a semiconductor substrate or any of upper layers above the semiconductor substrate. These layers may be conductive layers, such as metal layers. The lower most metal layer may also be referred to as a Metal-0 layer or an M0 layer. The metal layers may be surrounded by one or more insulating layers. The pads may also be referred to as test pads.

The test pads may be electrically connected or coupled to the test circuits or circuit elements thereof as test targets via wirings. The wirings may be provided in a lower most metal layer on a semiconductor substrate or any of upper metal layers above the semiconductor substrate. The wirings may run or extend in a horizontal direction (for example, on a horizontal X-Y plane) in the active areas of the scribe region 108. The wirings and the pads may be provided in the same layer with each other. The wirings and the pads may be provided in different layers from each other. In the latter case, the wirings and the pads are electrically connected or coupled to each other via, for example, contact plugs and other appropriate structures formed in and/or between the respective layers. In one instance, the pads and the wirings may be provided in a region referred to as an active chop NOT (that is logical NOT) region within each of the active areas of the scribe region 108. The active chop NOT region is where an active chop process is not performed for separation of the active areas. The active chop process may be part of etching processes using one or more photomasks or mask layers to form and pattern, for example, trenches, openings, holes, or the like for Mbit areas. These trenches, openings, holes, or the like may also be referred to as chops.

Each test circuit of the TEG may include one or more repeating patterns across a supporting material, such as a supporting surface, a supporting layer, and a supporting structure. The repeating patterns may include arrays of components and associated component parts. The denser the repeating patterns are, the greater the level of circuit integration is. The denser repeating patterns may be achieved by, for example, a multiple patterning (such as double patterning) lithography method. The repeating patterns or each of the repeating patterns may be formed by or include one or more line-and-space (L/S) patterns. The L/S patterns may include lines and spaces arranged next to each other. The L/S patterns may be formed by a conventional method, such as photolithography. There may be formed openings at locations where lines of the L/S patterns cross or intersect each other and/or at locations where spaces of the L/S patterns cross or intersect each other. The openings may be formed as one or more high-density repeating patterns. Such high-density repeating patterns enable fabrication of highly-integrated components, which provide test circuit(s).

Figure 2A:
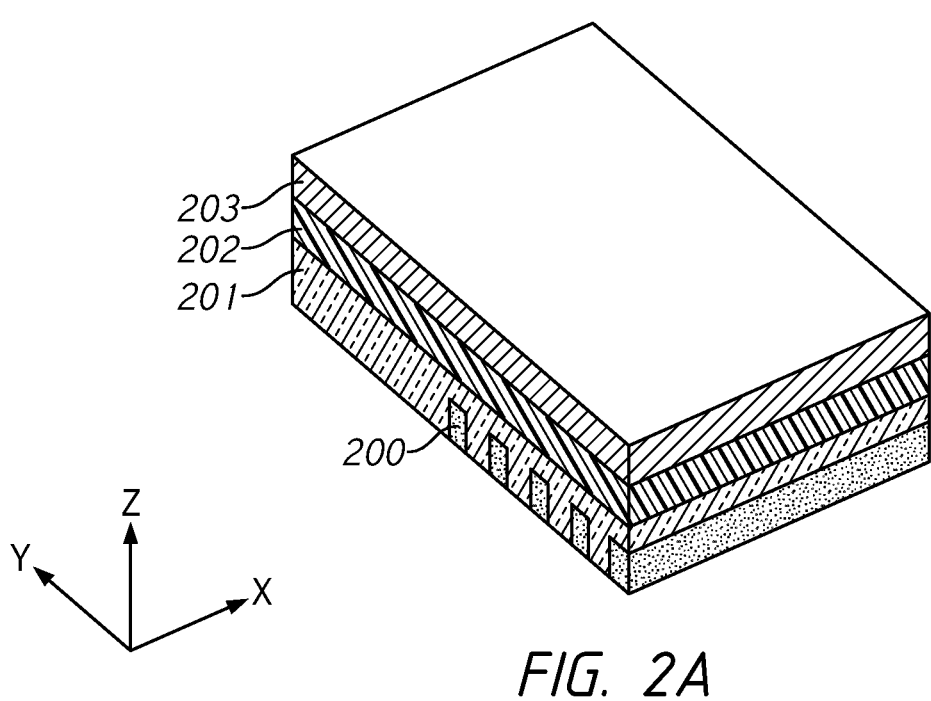
FIGS. 2A-2P depict processes of forming active regions in a scribe region according to an embodiment of the disclosure.
Figure 2B:
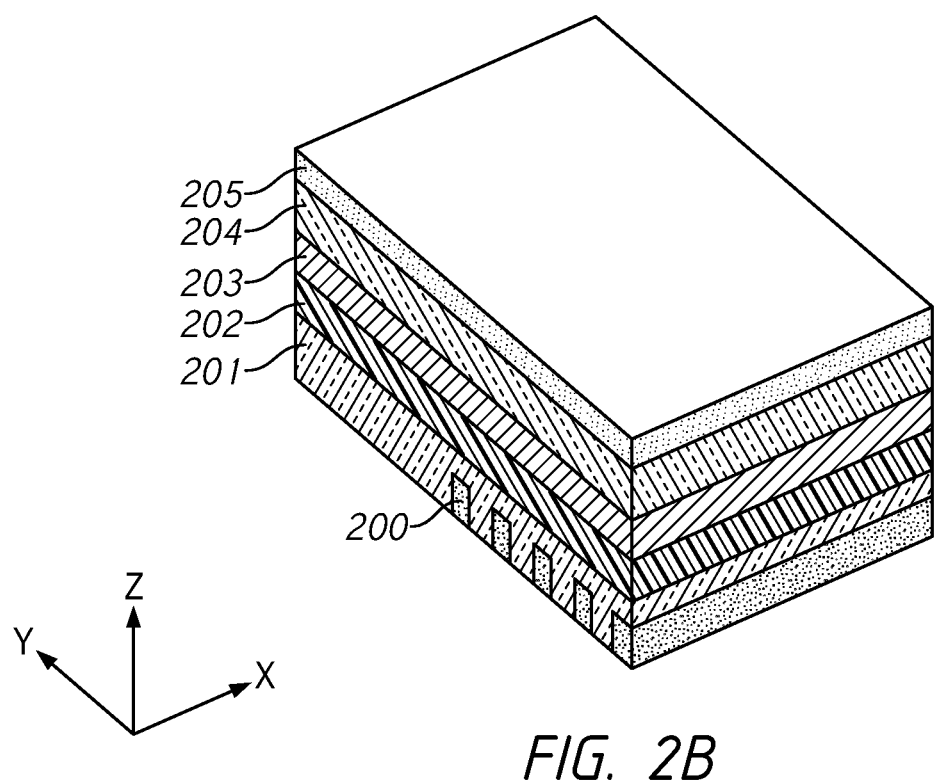
Figure 2C:
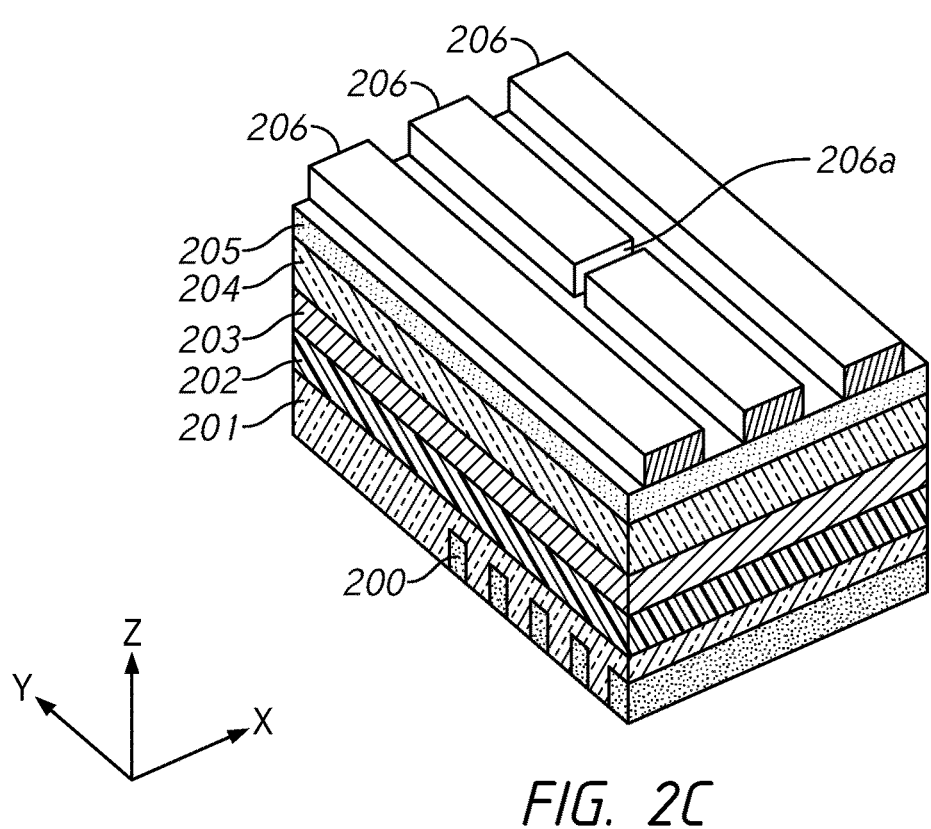
Figure 2D:
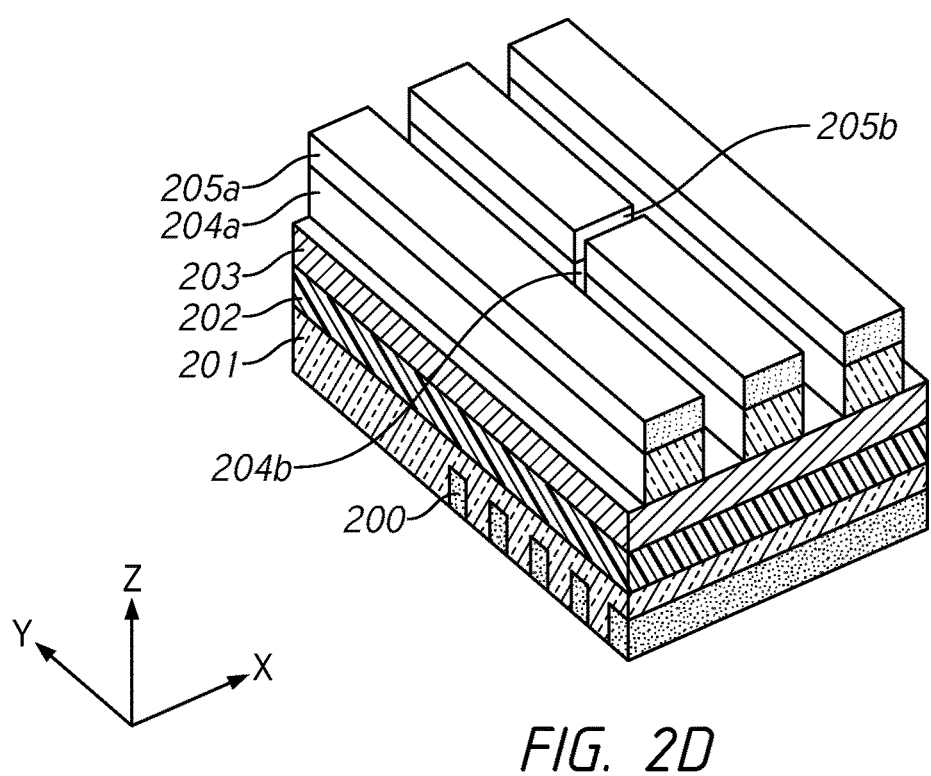
Figure 2E:
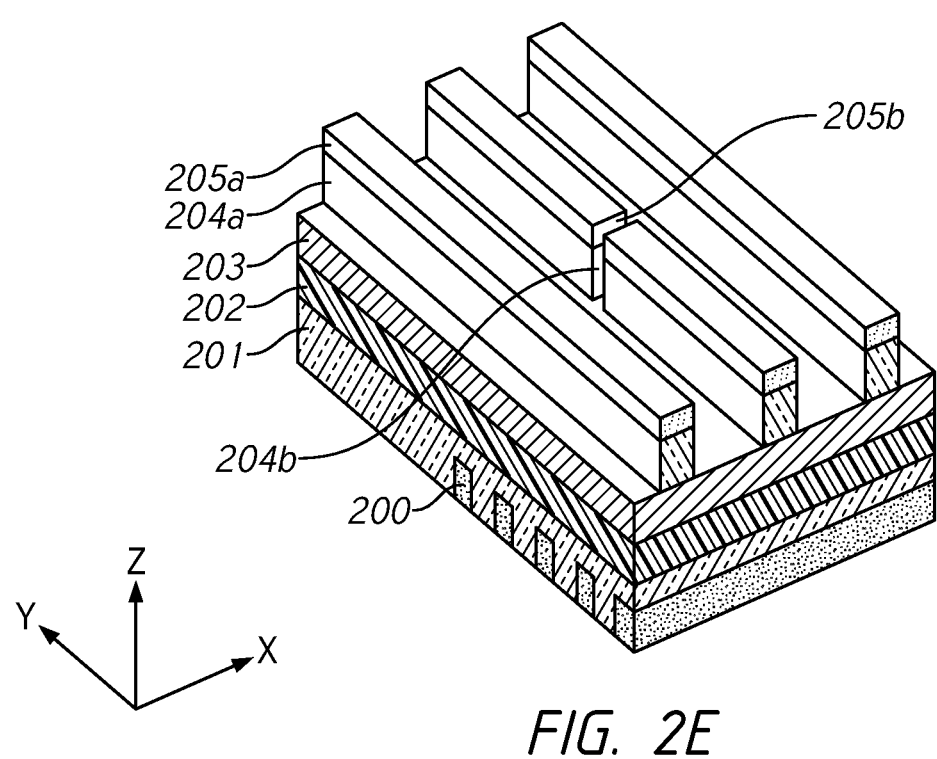
Figure 2F:
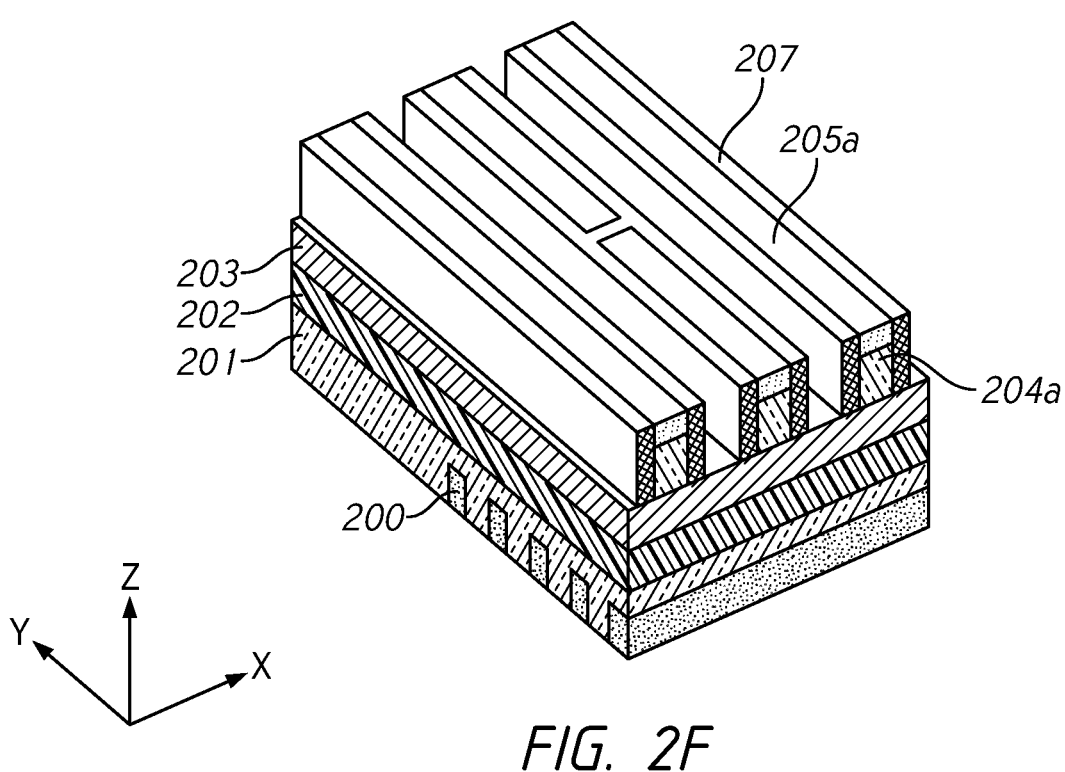
Figure 2G:
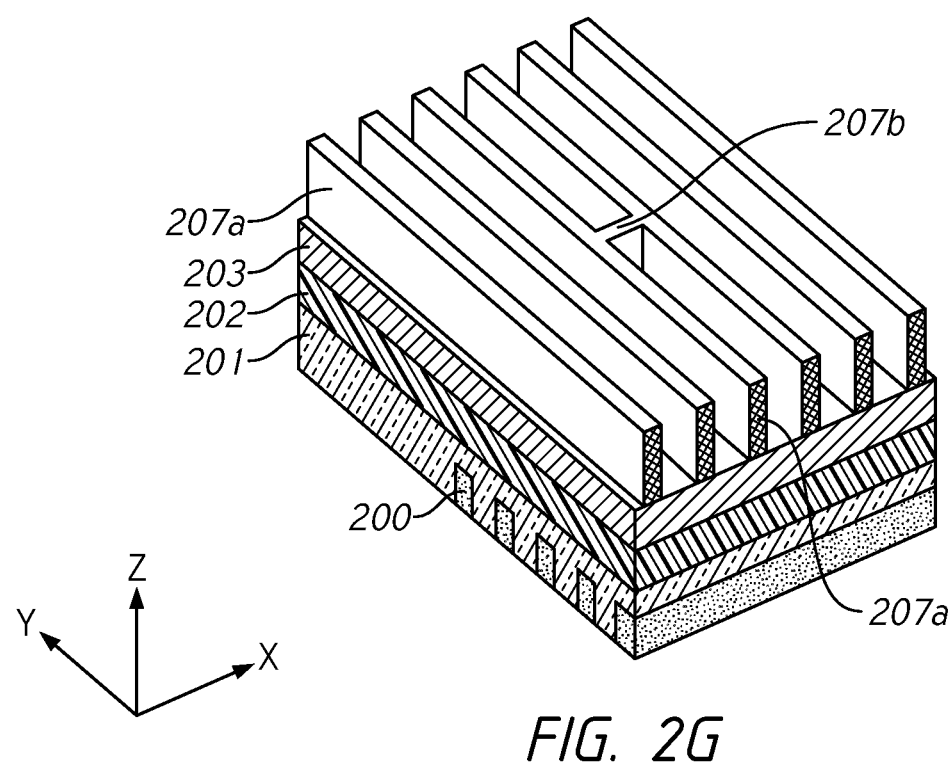
Figure 2H:
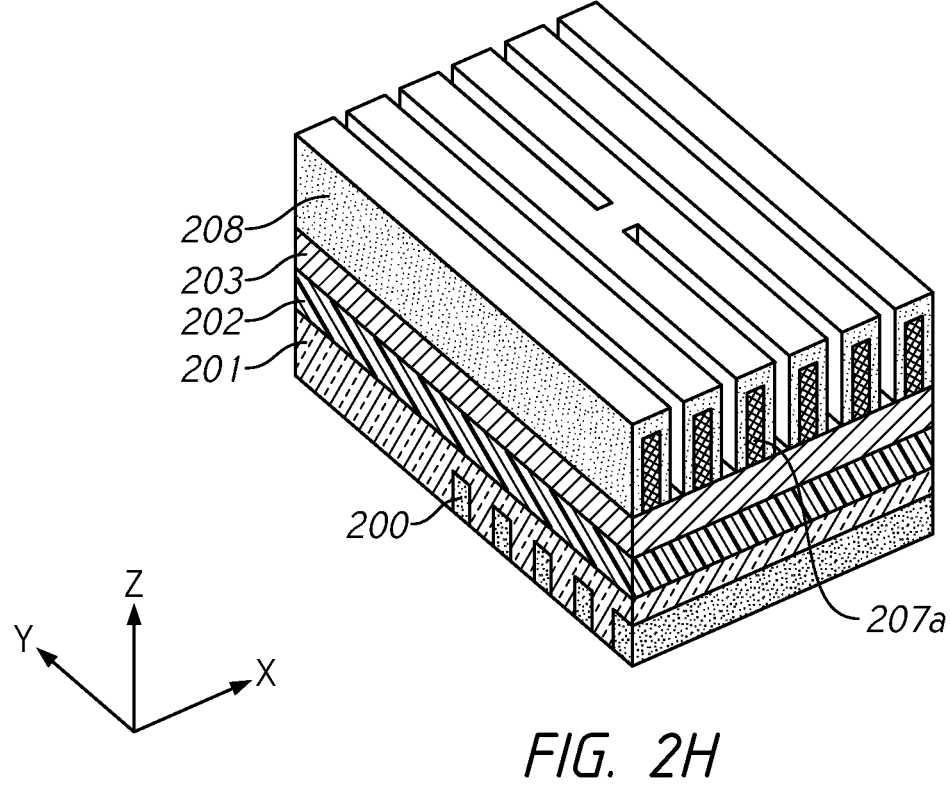
Figures 2I, 2J:
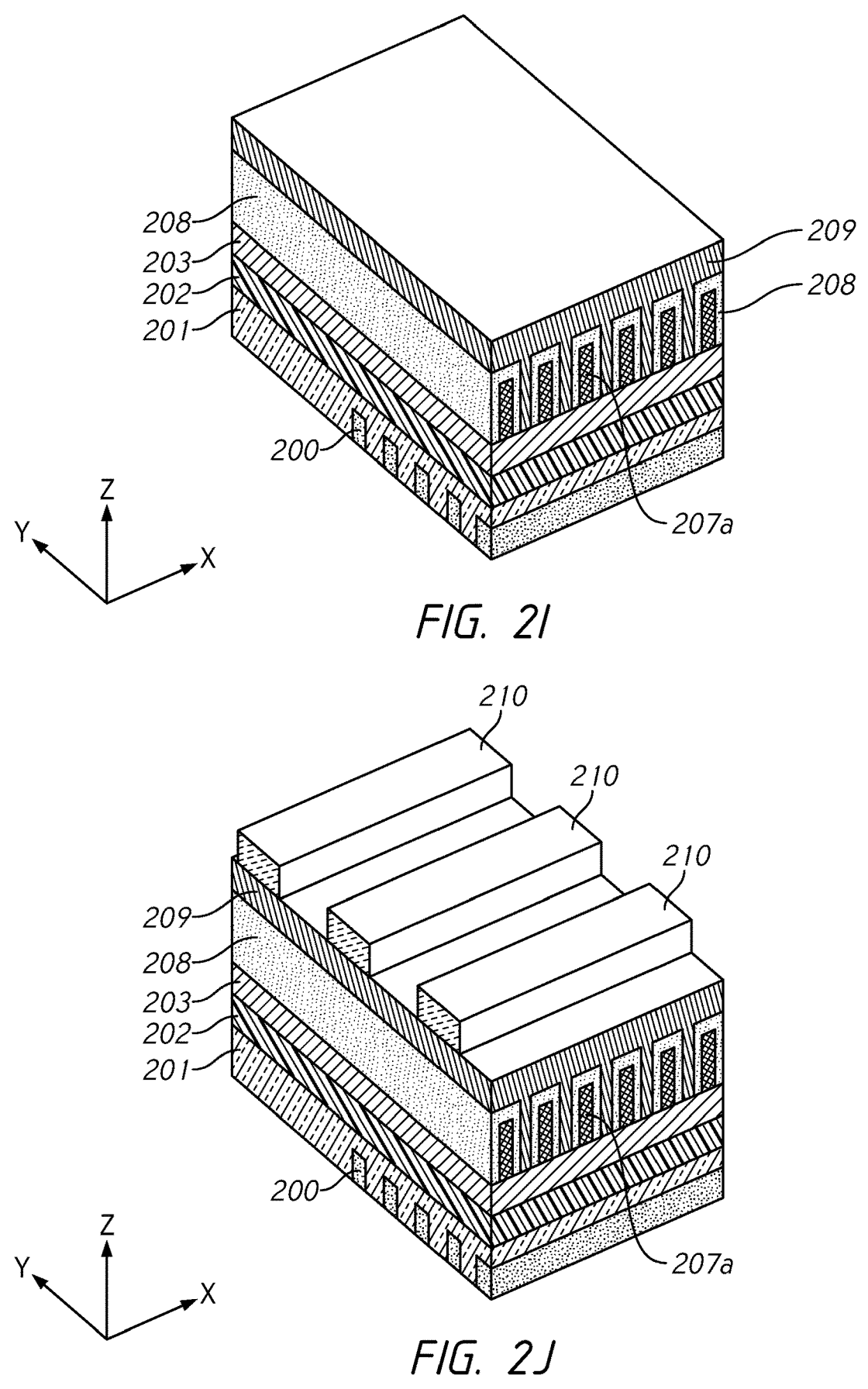
Figure 2K:
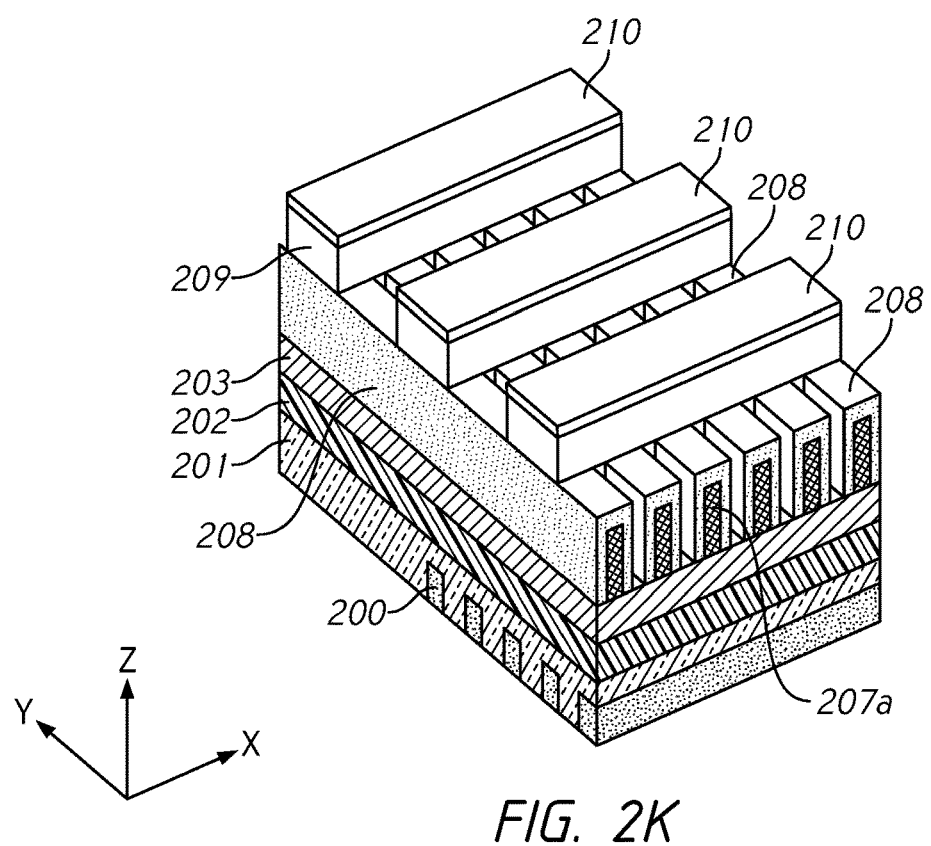
Figure 2L:
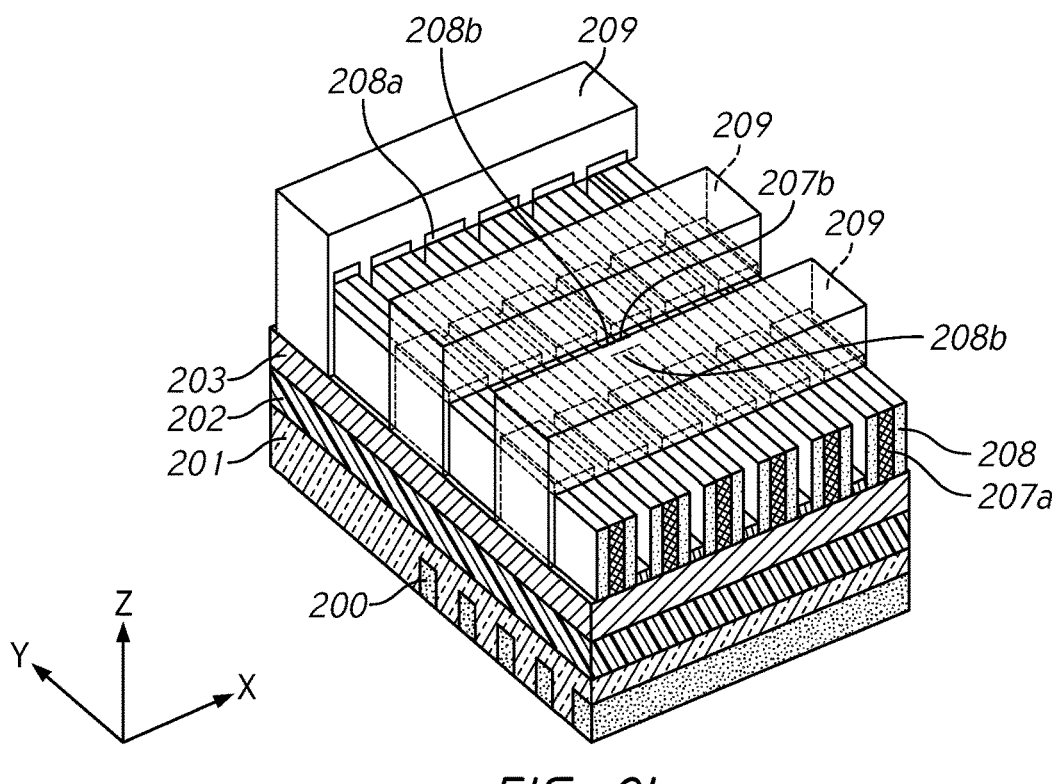
Figure 2M:
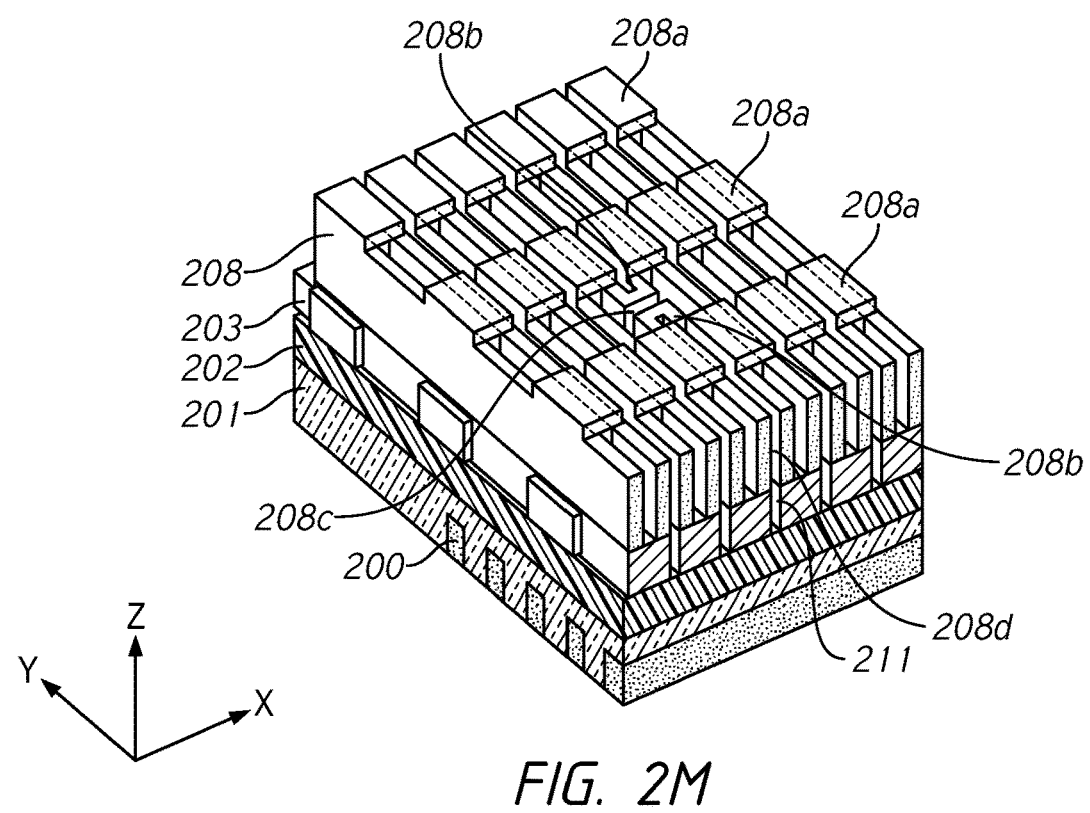
Figure 2N:
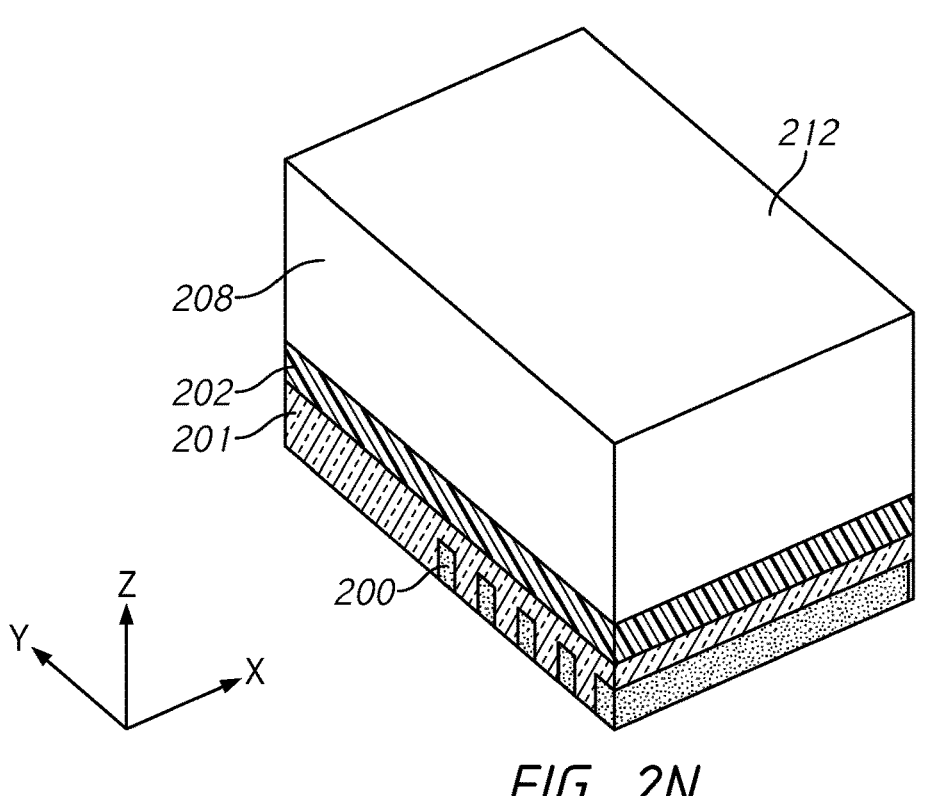
Figure 2O:
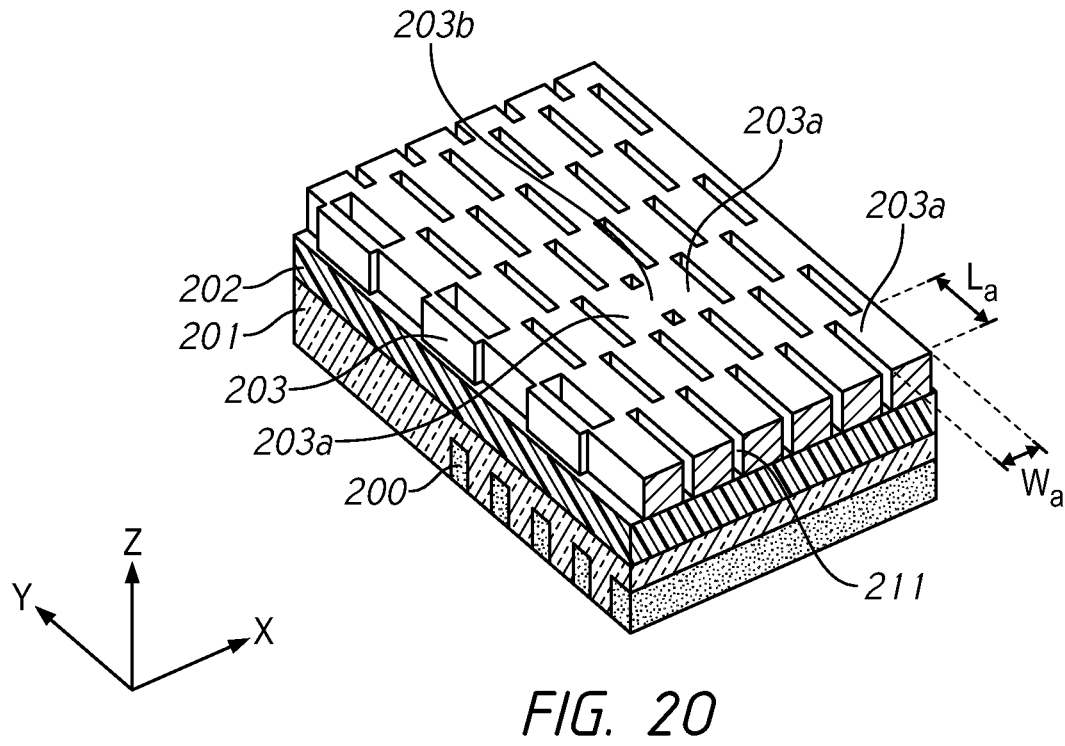
Figure 2P:
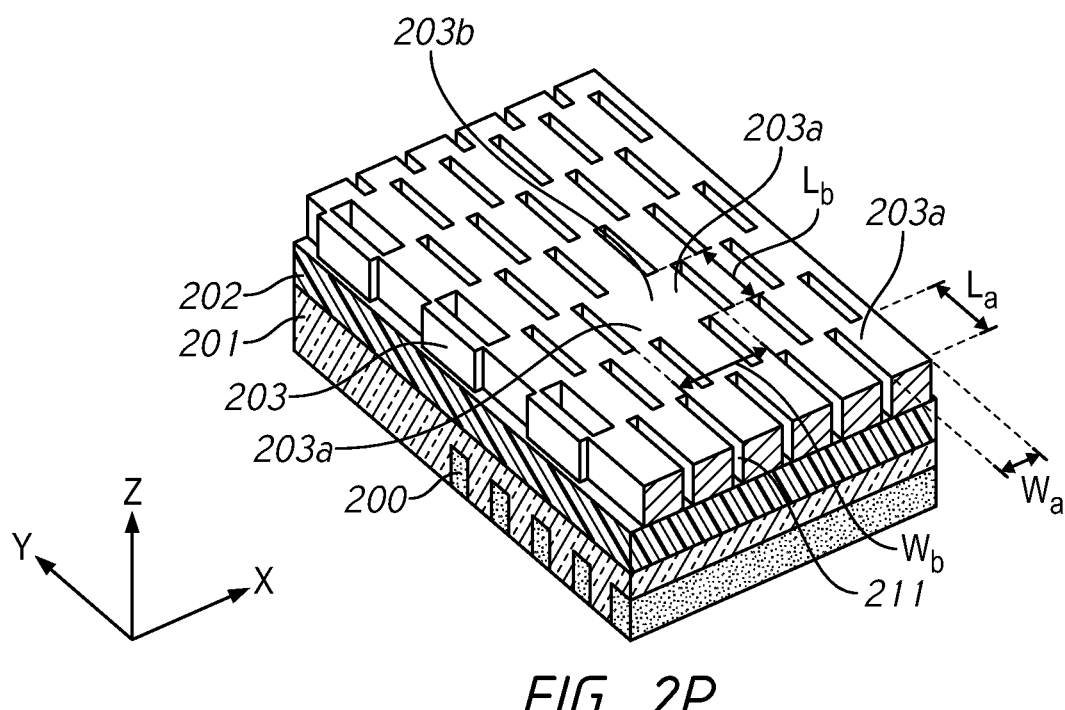

FIGS. 2A-2P depict examples of processes of forming active regions in a scribe region according to an embodiment of the disclosure.

Referring to FIG. 2A, a dielectric anti-reflective coating (DARC) 202 is formed on an upper surface of a semiconductor layer 201. The semiconductor layer 201 may include, for example, silicon (Si). The semiconductor layer 201 may be a semiconductor substrate. The semiconductor layer 201 may be a silicon film deposited on a semiconductor substrate. The silicon film may include amorphous silicon (a-Si). The upper surface of the semiconductor layer 201 provide a semiconductor surface. In the example, a plurality of active arrays 200 are provided in the semiconductor layer 201. The active arrays 200 may include active lines which are arranged in parallel with each other and spaced from one another in one direction and which extend in another direction perpendicular (or substantially perpendicular within reasonable tolerances of fabrication, measurement, etc.) to the one direction. The DARC 202 may be a DARC film. The DARC 202 may include anti-reflective materials. Anti-reflective materials may absorb radiation reflected from the semiconductor layer 201 during a photo process, such as a photolithography process. The anti-reflective materials may include known materials having such a property. The DARC 202 may form an anti-reflective barrier layer on the semiconductor layer 201. On a surface of the DARC 202, another layer 203 is deposited. The layer 203 provides a material where active regions, such as active regions 203a described below in detail, will be formed. The layer 203 may be referred to as an active region layer. The layer 203 or the material may also be referred to as a masking layer or a masking material. The layer 203 may comprise any suitable composition(s) having appropriate properties for subsequent processes, such as etching, for the formation of the active regions. The layer 203 may include, for example, silicon nitride and/or silicon oxide (e.g., silicon dioxide)

Referring to FIG. 2B, an underlayer or underlying layer (UL) 204 for first patterning of double patterning (as one example of multiple patterning) is deposited on a surface of the layer 203. The UL 204 may comprise any suitable composition(s) having appropriate properties for subsequent processes, such as etching. The UL 204 may include, for example, carbon formed by a spin-on process. The UL 204 may be formed by, for example, spin-on-carbon (SoC) back filling. On a surface of the UL 204, another anti-reflective coating (ARC) 205 is deposited. The ARC 205 may be an ARC film. The ARC 205 may include, for example, silicon.

Referring to FIG. 2C, a plurality of resist lines (may also be referred to as first resist lines) 206 are provided on a surface of the ARC 205. The resist lines 206 may include a resist material. The resist material may be a conventional resist material. The resist lines 206 are arranged in parallel to each other in a first direction (an X-direction or a direction along an X-axis illustrated in the drawing, for example). Each of the resist line 206 runs or extends in a second direction (a Y-direction or a direction along a Y-axis illustrated in the drawing, for example) perpendicular to the first (X) direction. Between the respective resist lines 206 are spaces provided separating the resist lines 206 from each other and running in the same direction as the resist lines 206. The resist lines 206 and spaces together provide line-and-space (L/S) patterns (may also be referred to as first L/S patterns). The resist lines 206 and spaces, thereby the L/S patterns, are formed with a conventional material by a conventional method, such as photolithography. The photolithography includes, for example, coating of resist to form a resist layer, exposure of the resist layer to light through a mask or a photomask having the same patterns as the L/S patterns at least in a plan view (in the X-Y plane in the drawing) to be formed in the resist layer, and development of the exposed resist layer. In the example, there are three resist lines 206 illustrated, but the number of the lines is not limited thereto and can be any number as appropriate. In the example, the resist lines 206 extend straight in the second (Y) direction, but the direction is not limited thereto and can be predetermined and designed in different directions in an appropriate manner. In the example, the middle line of the three resist lines 206 is separated into two portions by a gap 206a formed therebetween. The gap 206a may be a slit between the two separated portions. The gap 206a may have other shapes as appropriate.

Referring to FIG. 2D, after the resist lines 206 are developed, the underlying layers which are the ARC 205 and the UL 204 are etched with the resist lines 206 acting as an etching mask. The resist lines 206 are then removed. The remaining portions of the ARC 205 and UL 204 layers have lines 205a and 204a corresponding to the resist lines 206 with spaces therebetween. The L/S patterns of the resist lines 206 and the spaces are thus transferred to the ARC 205 and UL layers as L/S patterns formed by the lines 205a and 204a and their spaces. The gap 206a in the middle resist line 206 is also transferred as a gap 205b and a gap 204b in the middle ARC line 205a and the middle UL line 204a, respectively. The gaps 205b and 204b together form one gap extending vertically in a third direction (a Z-direction or a direction along a Z-axis illustrated in the drawing, for example) and splitting the middle ARC and UL lines 205a and 204a into two portions. This gap may also be referred to as a slit or a chop. In the drawing, the third (Z) direction is perpendicular to the first (X) and second (Y) directions.

Referring to FIG. 2E, the ARC and UL lines 205a and 204a are further etched to be thinner in width in the first (X) direction. The etching is selective for the materials of the ARC and UL lines 205a and 204a.

Referring to FIG. 2F, spacers (may also be referred to as first spacers) 207 are provided to side surfaces of the ARC and UL lines 205a and 204a by, for example, deposition and etch-back. The spacers 207 may include, for example, silicon and/or other appropriate materials. The spacers 207 form side walls covering the side surfaces of the respective ARC and UL lines 205a and 204a. The spacer 207 corresponding to the middle line also fills the gaps 205b and 204b.

Referring to FIG. 2G, the ARC and UL lines 205a and 204a are removed by etching. The spacers 207 become lines 207a with spaces therebetween, forming L/S patterns which are thinner and denser than the L/S patterns formed by the ARC and UL lines 205a and 204a. The spacer 207 that filled the gaps 205b and 204b remains unetched and forms a portion 207b that bridges the neighboring lines 207a in the first (X) direction.

Referring to FIG. 2H, further spacers (may also be referred to as second spacers) 208 are provided on side surfaces and top surfaces of the respective first spacer lines 207a by, for example, deposition. The second spacers 208 may include, for example, oxide and/or other appropriate materials.

Referring to FIG. 2I, another UL 209 for second patterning of the double patterning is deposited on the layer 203 and the second spacers 208. The UL 209 covers the top surfaces of the second spacers 208 and fill the spaces between second spacers 208 on the layer 203.

Referring to FIG. 2J, a plurality of resist lines (may also be referred to as second resist lines) 210 are provided on a surface of the UL 209. The resist lines 210 may include a resist material. The resist material may be a conventional resist material. The resist lines 210 are arranged in parallel to each other in the second (Y) direction. Each of the resist line 210 runs or extends in the first (X) direction. Between the respective resist lines 210 are spaces provided separating the resist lines 210 from each other and running in the same direction as the resist lines 210. The resist lines 210 and spaces together provide line-and-space (L/S) patterns (may also be referred to as second L/S patterns). The resist lines 210 and spaces, thereby the L/S patterns, are formed with a conventional material by a conventional method, such as photolithography. The second resist lines 210 and hence the second L/S patterns thereof run in a direction perpendicular or substantially perpendicular to the direction of the first resist lines 206 and hence the first L/S patterns thereof. The second resist lines 210 may be provided by and undergo similar processes to the first resist lines 206, including but not limited to resist coating, resist exposure, and resist development. The processes may be adjusted for the second patterning of the double patterning to achieve the intended second L/S patterns in an appropriate manner, differently from the processes for the first patterning of the first L/S patterns. In the example, there are three resist lines 210 illustrated, but the number of the lines is not limited thereto and can be any number as appropriate. In the example, the resist lines 210 extend straight in the first (X) direction, but the direction is not limited thereto and can be predetermined and designed in different directions in an appropriate manner.

Referring to FIG. 2K, the UL 209 is etched with the second resist lines 210 acting as an etching mask. The etch is selective for the material of the UL 209. While portions of the UL 209 under the second resist lines 210 remain, unmasked portions of the UL 209 are removed to reveal the top portions of the second spacers 208 in the spaces between the remained portions of the UL 209. Each portion of the UL 209 has a line shape corresponding to each of the three resist lines 210. In the example, the UL 209 form three lines (may also be referred to as UL lines) corresponding to the three resist lines 210.

Referring to FIG. 2L, the revealed top portions of the second spacers 208 are removed by etch back to reveal the top portions of the first spacers 207. The remaining second resist lines 210 (see FIG. 2K) and some upper portions of the UL lines 209 are also removed during the etch back. Portions 208a of the second spacers 208 under the UL lines 209 remain unremoved. In the drawing, two of the three UL lines 209 are illustrated in dotted-line (phantom) view to show the other elements and the structures under and around the lines UL 209. The second spacers 208 remain like walls covering side surfaces of the lines 207a of the first spacers 207. The removal of the top portions of the second spacers 208 reveals the bridge 207b. Furthermore, the second spacers 208 have portions 208b forming wall-like structures and covering side surfaces of the bridge 207b. These portions 208b are formed when the second spacers 208 are provided during the process of FIG. 2H.

Referring to FIG. 2M, the remaining UL 209 and the lines 207a of the first spacers 207 are removed by further etching. The portions 208a of the second spacers 208 are revealed. The removal of the lines 207a form an opening 208c at a position corresponding to the position where the bridge 207b had been. The opening 208c is sandwiched between the wall-like portions 208b. The etching also removes portions of the layer 203 under spaces 208d between the neighboring second spacers 208. The removal of the portions of the layer 203 form openings 211 under the spaces 208d. Each of the openings 211 may have a slit-like shape or a slot-like shape.

Referring to FIG. 2N, a layer 212 is formed over the entirety or substantially the entirety of the remaining portions, including at least the layer 203, the second spacers 208, and openings 211, on the DARC 202. The layer 212 may comprise any suitable composition(s) having appropriate properties for subsequent processes, such as etching. The layer 212 may include, for example, carbon formed by a spin-on process. The layer 212 may be formed by, for example, spin-on-carbon (SoC) back filling. The layer 212 fills the openings 211 and any uneven portions on the surfaces of the layer (or the active region layer) 203 and the second spacers 208. The layer 212 also fills the opening 208c formed at the previous process (see FIG. 2M). The layer 212 may be referred to as a fill layer, a cover layer, or the like.

Referring to FIGS. 2O and 2P, the layer 212 and the second spacers 208 are removed by etching. The etching is selective for the materials of the layer 212 and the second spacers 208. By this process, the slit-like or slot-like openings 211 are revealed in the remaining layer 203. Because of the layer 212 provided at the previous process (see FIG. 2N), the second spacers 208 are etched and removed uniformly together with the layer 212, leaving the openings 211 with the intended shapes and sizes in the layer 203. The openings 211 are arranged in a staggered, repeating pattern in the X-Y plane. For example, in the drawing, the first three openings 211 aligning along the Y-axis and positioned in the far left side of the X-axis and the second three openings 211 next to the first three openings 211 in the X-axis are staggered with one another along the Y-axis. The same pattern goes for the rest of the openings 211. The openings 211 split the layer 203 into small island-like portions (may also be referred to as first portions) 203a. Each portion 203a has a width W a and a length L a in the X-Y plane. These portions 203a provide active regions of a scribe region, such as the scribe region 108 illustrated in FIG. 1, where TEG circuits are provided. The portions 203a may therefore be referred to as active regions. The openings 211 and the active regions 203a form repeating patterns. The active regions 203a are arranged in matrix in the scribe region.

Continuing with reference to FIGS. 2O and 2P, at a position corresponding to the position where the opening 208c in the second spacer 208 (see FIG. 2M) had been in the X-Y plane, an opening like the openings 211 is not formed since the opening 208c was filled with the material of the layer 212 at the previous process (see FIG. 2N). At this position, a portion 203b bridging and connecting two active regions 203a arranged adjacently among the active regions 203a arranged in matrix is formed. This portion 203b may therefore be referred to as an active bridge region. The active bridge region 203b together with the two connected active regions 203a has an enlarged shape or together form an enlarged active region greater in size than the other active regions 203a at least in a plan view. In the example, the enlarged active region as a combination of the active bridge region 203b and the two connected active regions 203a has a width $W_b$ more than twice as wide as the width $W_a$ of the single active region 203a while its length $L_b$ is the same as the length $L_a$ (see FIG. 2P). The enlarged active region has thus an elongated shape at least in one direction in a plan view than the active regions 203a. The enlarged active region or the elongated active region than the regular-sized active regions 203a may accommodate more TEG circuits or circuit elements thereof and realize a more suitable and efficient TEG in a scribe region of a semiconductor chip.

In the example of FIG. 2O, there are some small portions of the opening 211 left in the enlarged active region. In the example of FIG. 2P, the enlarged active region has no portions of the opening 211 left therein. The difference in these two examples is due to, for example, predetermined designs and specifications to provide various active bridge regions 203b and hence various enlarged active regions in shape and size. In either case, in the present example, the active bridge region 203b is provided by the processes of the multiple patterning according to the present embodiment. While in the present example, the active bridge region 203b is formed between the two neighboring active regions 203a, in another example, the active bridge region 203b may be formed to connect three or more neighboring active regions 203a in the matrix of the active regions 203a by, for example, appropriately designing a layout and adjusting patterning conditions.

Figure 3A:
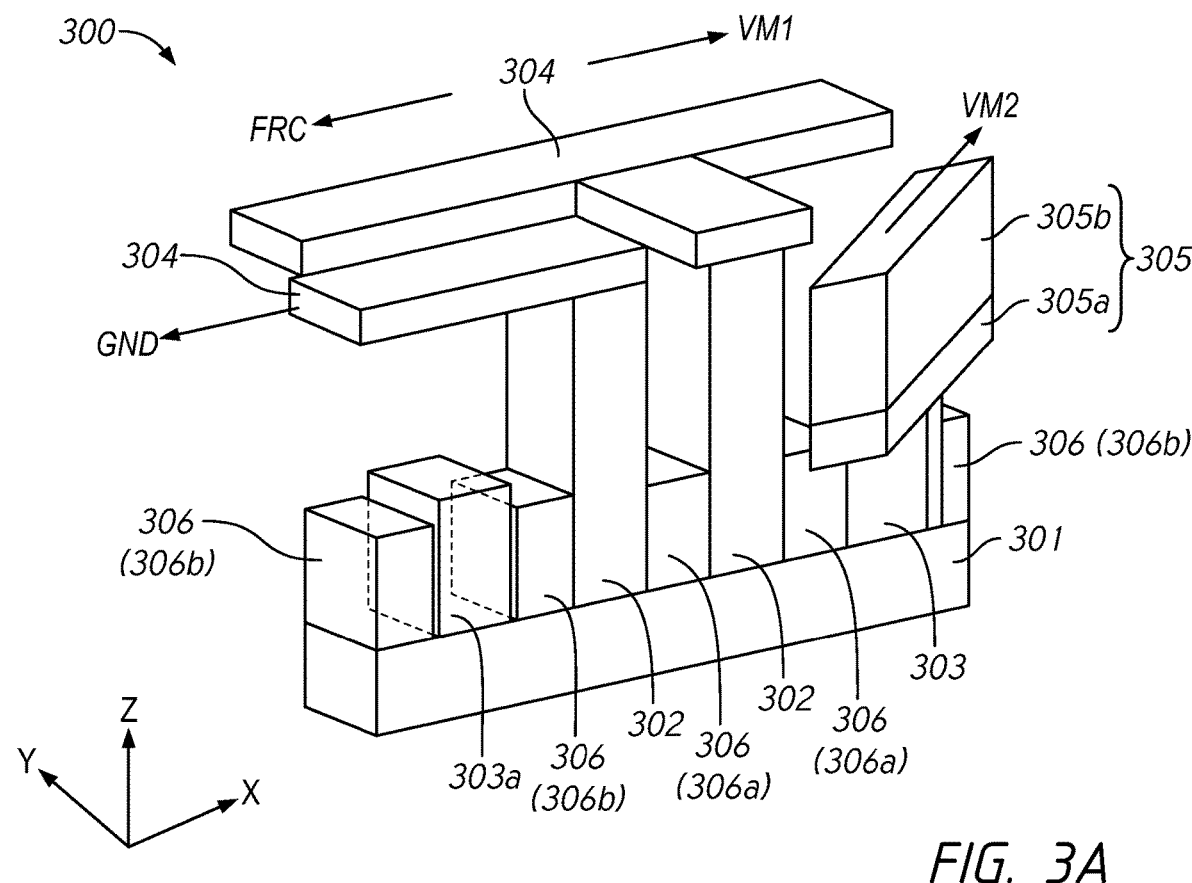
FIGS. 3A-3C depict part of a TEG on an active region of a scribe region, an equivalent circuit and a schematic configuration thereof, respectively, according to an embodiment of the disclosure.
Figure 3B:
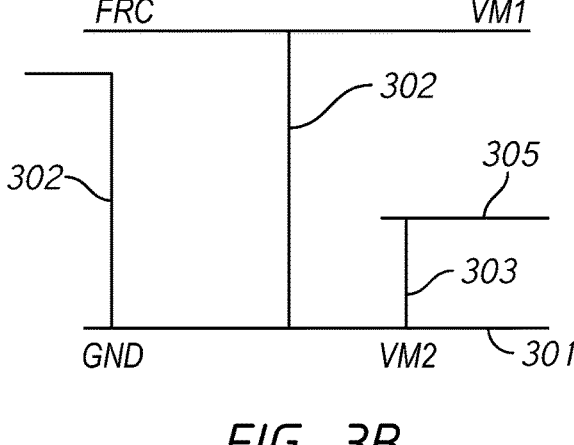
Figure 3C:
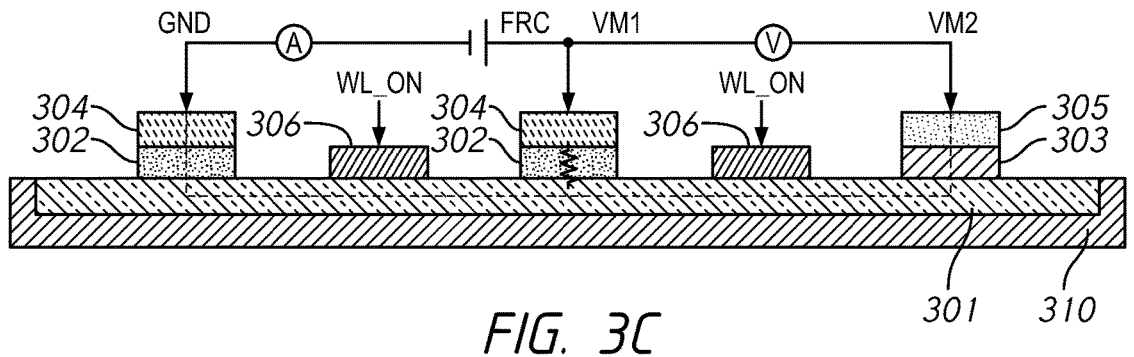

FIG. 3A depicts an example of part of a TEG 300 including an enlarged active region in a scribe region according to an embodiment of the disclosure. FIGS. 3B and 3C depict an example of an equivalent circuit and a schematic configuration of the part of the TEG 300 of FIG. 3A. The scribe region, such as the scribe region 108 in FIG. 1, has an active region 301. The active region 301 may be provided in or on a supporting layer 310. The supporting layer 310 corresponds to, for example, the supporting layer 201 (which may also include a surface coating, such as the DARC 202) of FIGS. 2A-2P. The active region 301 corresponds to, for example, the enlarged active region provided by the active bridge region 203b and the two bridged active regions 203a of FIG. 2O or FIG. 2P. The active region 301 hence has the enlarged proportion than other active regions (not separately depicted in FIGS. 3A-3C) which may be provided around the active region 301 in a similar manner to the example of FIG. 2O or FIG. 2P.

On the active region 301, various circuit elements of the TEG 300 are provided. In the example, at least two capacitance contacts 302 and at least one bit contact 303 as well as wirings 304 and a bit line (or a digit line) 305 are provided. As part of a test transistor or a transistor structure, the capacitance contacts 302 are electrically coupled or connected to a capacitor (not separately depicted) via the wirings 304, and the bit contact 303 is electrically coupled or connected to the bit line 305. There may also be test pads (not separately depicted) on or above the active region 301 as appropriate. These elements may be surrounded by one or more insulating layers or insulating materials.

The wirings 304 may be formed in one or more metal layers. The metal layers may include a metal material, such as tungsten. In the example, the wirings 304 are provided in one metal layer, which may be a lower most metal layer (M0). The wirings 304 are electrically coupled or connected to a first voltage (VM1), an input/force (FRC), and a ground (GND). The bit line 305 may include, for example, a first layer 305a and a second layer 305b. The first layer 305a may include a conductive material, such as tungsten. The second layer 305b may include a conductive material, such as nitride, different from the material of the first layer 305a. The bit line 305 is electrically coupled or connected to a second voltage (VM2). Word lines 306 are also provided at appropriate positions. In the example, the word lines 306 are arranged at least between the two capacitance contacts 302 and between the bit contact 303 and the neighboring capacitance contact 302. Additional word lines 306 may be provided. Among the word lines 306, some word lines 306a may be turned on (WL_ON in FIG. 3C) while some word lines 306b may be turned off during testing.

Each of the active regions including the active region 301 in the scribe region may have a test transistor. The active region 301 in accordance with the present embodiment can provide a transistor structure in which the two capacitance contacts 302 are electrically connected to each other via the active region 301. A resistance value can thus be measured in a further efficient manner. For instance, the transistor structure on the active region 301 and hence the TEG 300 according to the present embodiment may be further suitable for Sccon Kelvin measurements for the structure is further simplified with less wirings, contacts, or the like. The structure has further flexibility in terms of accuracy of design and fabrication of a circuit layout. The structure is less restricted to minimum size dimensions of multiple patterning, such as double patterning. The structure enhances easiness of circuit design and verification. The structure may also further efficiently prevent or mitigate leakage of a current path. Overall, reliability and robustness of the circuit structure is further improved, and testing of circuit electric properties becomes further efficient and accurate.

The TEG circuit elements are not limited to the present example and embodiment and can be designed and provided in accordance with the intended testing, TEG circuit specifications, or the like. In one instance, to further efficiently use the enlarged space of the active region 301, one or more further bit contacts, one or more further word lines, or the like may be provided. In the example of FIG. 3A, another bit contact 303*a* is provided.

Figure 4A:
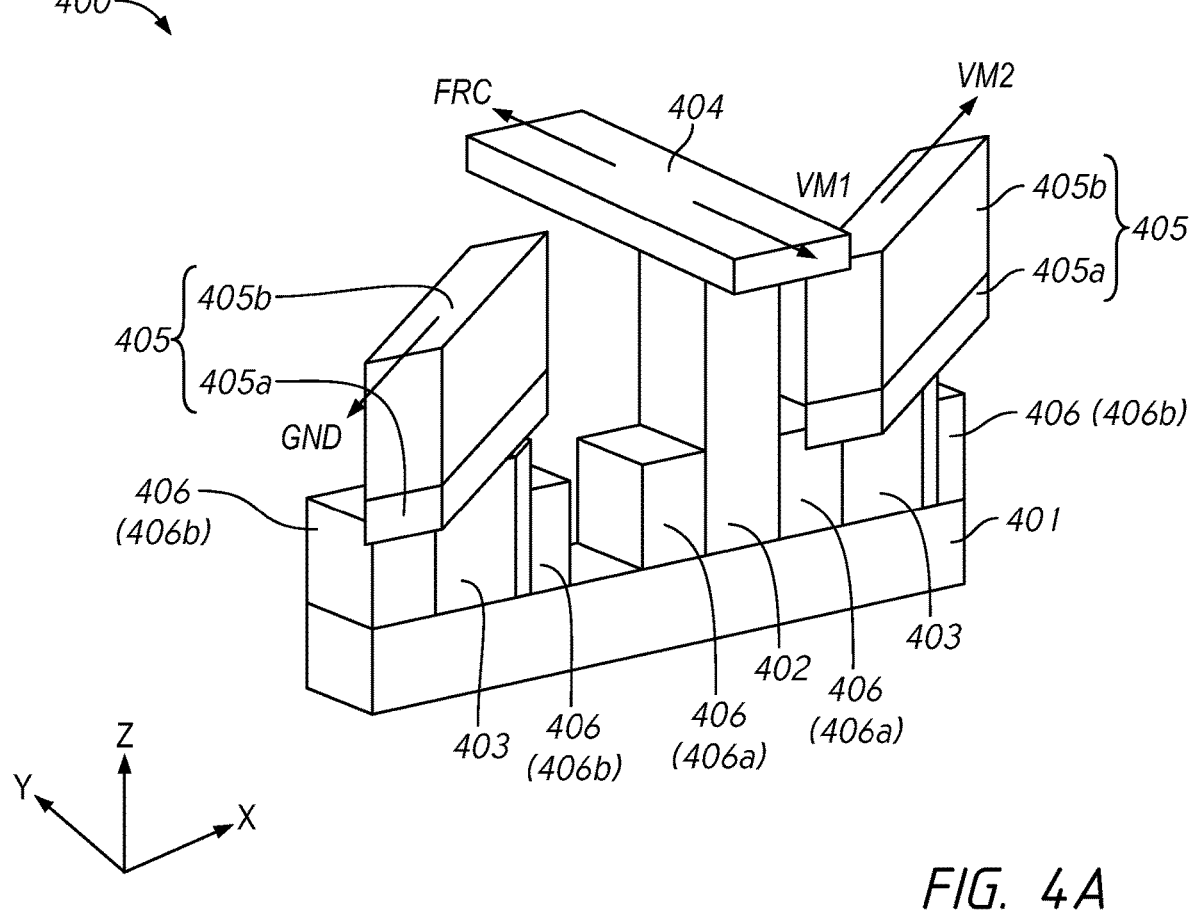
FIGS. 4A and 4B depict part of a TEG on an active region of a scribe region and an equivalent circuit thereof, respectively, according to an embodiment of the disclosure.
Figure 4B:
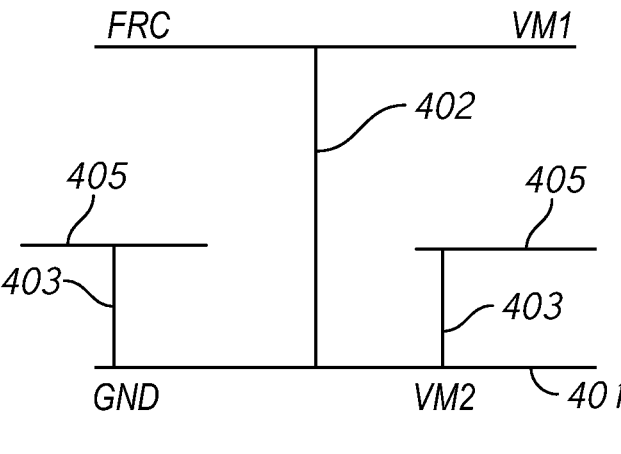

FIG. 4A depicts an example of a part of a TEG 400 including an enlarged active region in a scribe region according to an embodiment of the disclosure. FIG. 4B depicts an example of an equivalent circuit of the part of the TEG 400 of FIG. 4A. The scribe region, such as the scribe region 108 in FIG. 1, has an active region 401. The active region 401 may be provided in or on a supporting layer (not separately depicted). The supporting layer corresponds to, for example, the supporting layer 201 (which may also include a surface coating, such as the DARC 202) of FIGS. 2A-2P or the supporting layer 301 of FIG. 3C. The active region 401 corresponds to, for example, the enlarged active region provided by the active bridge region 203*b* and the two bridged active regions 203*a* of FIG. 2O or FIG. 2P. The active region 401 hence has the enlarged proportion than other active regions (not separately depicted in FIGS. 4A-4B) which may be provided around the active region 401 in a similar manner to the example of FIG. 2O or FIG. 2P.

On the active region 401, various circuit elements of the TEG 400 are provided. In the example, at least one capacitance contact 402 and at least two bit contacts 403 as well as a wiring 404 and bit lines (or digit lines) 405 are provided. As part of a test transistor or a transistor structure, the capacitance contact 402 is electrically coupled or connected to a capacitor (not separately depicted) via the wiring 404, and the bit contacts 303 are electrically coupled or connected to the bit lines 405. There may also be test pads (not separately depicted) on or above the active region 401 as appropriate. These elements may be surrounded by one or more insulating layers or insulating materials.

In the example, the wiring 404 is provided in a metal layer, which may be a lower most metal layer (M0). The wirings 404 is electrically coupled or connected to a first voltage (VM1) and an input/force (FRC). Each of the bit line 405 may include, for example, a first layer 405*a* and a second layer 405*b*. The first layer 405*a* may include a conductive material, such as tungsten. The second layer 405*b* may include a conductive material, such as nitride, different from the material of the first layer 405*a*. One of the bit lines 405 is electrically coupled or connected to a second voltage (VM2). Another of the bit lines 405 is electrically coupled or connected to a ground (GND). Word lines 406 are also provided at appropriate positions. In the example, the word lines 406 are arranged at least between one of the bit contacts 403 and the capacitance contact 402 (on one side), next to the capacitance contact 402 (on another side), and next to another one of the bit contacts 403. Additional word lines 406 may be provided. Among the word lines 406, some word lines 406*a* may be turned on while some word lines 406*b* may be turned off during testing.

Each of the active regions including the active region 401 in the scribe region may have a test transistor. The active region 401 in accordance with the present embodiment can provide a transistor structure in which the two bit contacts 403 are electrically connected to each other via the active region 401. A resistance value can thus be measured in a further efficient manner. The transistor structure on the active region 401 and hence the TEG 400 according to the present embodiment can achieve the same or substantially the same effects and advantages as the TEG 300 and its structure. In one instance, each of the TEGs 300 and 400 or the circuit structure thereof may also be referred to as a parametric cell device or a parametric test structure for measuring an electric property/characteristic in a semiconductor device, such as a memory device.

Although various embodiments of the disclosure have been described in detail, it will be understood by those skilled in the art that embodiments of the disclosure may extend beyond the specifically described embodiments to other alternative embodiments and/or uses and modifications and equivalents thereof. In addition, other modifications which are within the scope of the disclosure will be readily apparent to those of skill in the art based on the described embodiments. It is also contemplated that various combination or sub-combination of the specific features and aspects of the embodiments may be made and still fall within the scope of the disclosure. It should be understood that various features and aspects of the embodiments can be combined with or substituted for one another in order to form varying mode of the embodiments. Thus, it is intended that the scope of the disclosure should not be limited by the particular embodiments described above.

What is claimed is:

1. An apparatus, comprising:
   a plurality of active regions on a semiconductor substrate;
   an enlarged active region including an active bridge region and at least two adjacent active regions connected by the active bridge region among the plurality of active regions, wherein the enlarged active region is greater in size, at least in a plan view, than other active regions adjacent to the enlarged active region among the plurality of active regions; and
   a plurality of test circuit elements on the enlarged active region.

2. The apparatus according to claim 1, wherein the enlarged active region has an elongated shape at least in one direction in the plan view.

3. The apparatus according to claim 2, wherein
   the two active regions are arranged in line along the one direction with a gap therebetween, and
   the active bridge region fills the gap.

4. The apparatus according to claim 2, wherein the enlarged active region is spaced from the other active regions among the plurality of active regions by at least one opening.

5. The apparatus according to claim 1, wherein the test circuit elements include two capacitance contacts on the enlarged active region.

6. The apparatus according to claim 5, wherein the test circuit elements further include at least one bit contact on the enlarged active region.

7. The apparatus according to claim 1, wherein the test circuit elements include two bit contacts on the enlarged active region.

8. The apparatus according to claim 7, wherein the test circuit elements further include at least one capacitance contact on the enlarged active region.

9. The apparatus according to claim 1, wherein the test circuit elements include test transistor elements.

11

10. An apparatus, comprising:
a plurality of active regions arranged in matrix in a scribe region on a semiconductor substrate;
an active bridge region physically connecting at least first and second active regions arranged adjacently among the plurality of active regions, the active bridge region and the at least first and second active regions forming an enlarged active region at least in a first horizontal direction in a plan view, wherein the enlarged active region has a first horizontal-direction size greater than a third active region adjacent to the enlarged active region among the plurality of active regions; and
a plurality of test circuit elements on the enlarged active region, the plurality of test circuit elements including two capacitance contacts or two bit contacts electrically connected to each other by the enlarged active region.

11. The apparatus according to claim 10, wherein
the at least first and second active regions are arranged in line along the first horizontal direction with a gap therebetween, and
the active bridge region fills the gap.

12. The apparatus according to claim 10, wherein the two capacitance contacts are coupled to a capacitance.

13. The apparatus according to claim 10, wherein the two bit contacts are coupled to a bit line.

14. The apparatus according to claim 10, wherein the two capacitance contacts or the two bit contacts are part of a test transistor.

15. The apparatus according to claim 10, further comprising a plurality of word lines configured to be turned on and off during testing of a circuit electric property.

16. A test element group in a scribe region on a semiconductor substrate, comprising:
a plurality of active regions in the scribe region, including:
an enlarged active region as a combination of an active bridge region and two adjacent active regions connected by the active bridge region among the plurality of active regions; and
a non-bridged active region adjacent to the active bridge region among the plurality of active regions, wherein the enlarged active region is greater in size than the non-bridged active region at least in a plan view; and
a plurality of test circuit elements on the enlarged active region.

17. The test element group according to claim 16, wherein the enlarged active region has an elongated shape at least in a first horizontal direction in the plan view, having a first size greater than the non-bridged active region in the first horizontal direction and a second size same as the non-bridged active region in a second horizontal direction perpendicular to the first horizontal direction.

18. The test element group according to claim 17, wherein
the two active regions are arranged in line along the first horizontal direction with a gap therebetween, and
the active bridge region fills the gap.

19. The test element group according to claim 16, wherein the test circuit elements are at least part of a test transistor.

20. The test element group according to claim 16, wherein the test element group is at least part of a memory device.

* * * * *